(12) United States Patent
Cong

(10) Patent No.: US 7,573,339 B2
(45) Date of Patent: Aug. 11, 2009

(54) RING OSCILLATOR WITH ULTRA-WIDE FREQUENCY TUNING RANGE

(75) Inventor: Yonghua Cong, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 96 days.

(21) Appl. No.: 11/689,586

(22) Filed: Mar. 22, 2007

(65) Prior Publication Data

US 2008/0231378 A1    Sep. 25, 2008

(51) Int. Cl.
 *H03K 3/03* (2006.01)
(52) U.S. Cl. .............................. 331/57; 331/179; 331/34
(58) Field of Classification Search ................... 331/57, 331/34, 177 R, 179, 185
See application file for complete search history.

(56) References Cited

U.S. PATENT DOCUMENTS

| | | | | |
|---|---|---|---|---|
| 5,777,520 | A * | 7/1998 | Kawakami | 331/1 R |
| 6,154,099 | A * | 11/2000 | Suzuki et al. | 331/57 |
| 6,650,196 | B2 * | 11/2003 | Nguyen | 331/179 |
| 7,102,449 | B1 * | 9/2006 | Mohan | 331/57 |
| 2002/0039051 | A1 * | 4/2002 | Ito et al. | 331/25 |
| 2002/0163392 | A1 * | 11/2002 | Horan et al. | 331/57 |
| 2007/0152763 | A1 * | 7/2007 | Mansuri | 331/57 |

OTHER PUBLICATIONS

Chan-Hong Park and Beomsup Kim, *A Low Noise, 900-MHz VCO in 0.6μm CMOS*, IEEE Journal of Solid-State Circuits, vol. 34, No. 5, May 1999, pp. 586-591.
Seog-Jun Lee, Beomsup Kim, and Kwyro Lee, *A Novel High-Speed Ring Oscillator for Multiphase Clock Generation Using Negative Skewed Delay Scheme*, IEE Journal of Solid-State Circuits, vol. 32, No. 2, Feb. 1997, pp. 289-291.

* cited by examiner

*Primary Examiner*—Robert Pascal
*Assistant Examiner*—Ryan J. Johnson
(74) *Attorney, Agent, or Firm*—McAndrews Held & Malloy Ltd.

(57) ABSTRACT

Methods and systems for tuning an oscillator are disclosed and may comprise dividing a desired frequency range of a delay-cell based ring oscillator into segments, and tuning the delay-cell based ring oscillator over an ultra-wide frequency range by utilizing these divided segments. The enabled segment may determine the frequency range and the oscillator may be tuned within these segments. The delay may be adjusted utilizing a negative skew technique, and may be controlled by one or more digital codes. The oscillating frequency within each segment may be adjusted utilizing a control voltage or control current. The voltage or current may be buffered and utilized as a common supply of the delay cells.

30 Claims, 5 Drawing Sheets

RING OSCILLATOR WITH ULTRA-WIDE FREQUENCY TUNING RANGE

CROSS-REFERENCE TO RELATED APPLICATIONS/INCORPORATION BY REFERENCE

Not Applicable

FEDERALLY SPONSORED RESEARCH OR DEVELOPMENT

Not Applicable

MICROFICHE/COPYRIGHT REFERENCE

Not Applicable

FIELD OF THE INVENTION

Certain embodiments of the invention relate to oscillator circuits. More specifically, certain embodiments of the invention relate to a method and system for a ring oscillator with ultra-wide frequency tuning range.

BACKGROUND OF THE INVENTION

Phase locked loops (PLLs) are widely used to provide clock signals for integrated circuits in radio, telecommunications, and other applications where a stabilized frequency source or detection of a signal in noise is required. For example, in wireless technology, systems with multiple frequencies are in use, with frequencies in a single system ranging from several hundred megahertz up to a few gigahertz. For compact and power-efficient systems supporting multiple wireless standards, maximum hardware sharing is necessary.

PLLs are closed-loop feedback systems that generate a signal equal in phase and frequency in relation to an input signal. Within the feedback loop of the PLL is a voltage-controlled oscillator (VCO), which generates a signal at a frequency that is a function of the applied bias. Typical designs for VCOs include LC-tank oscillators, crystal oscillators, surface acoustic wave oscillators, and ring oscillators. Of these types of oscillators, only LC-tank oscillators and ring oscillators lend themselves to integration in standard CMOS designs. In general, for a given design, these oscillators have a narrow tuning range, which would dictate that there be multiple clock sources for applications requiring a variety of clock frequencies.

While LC-tank oscillators are capable of accurate clock signals, they generally require an off-chip inductor or an on-chip spiral inductor. Integrating a high quality inductor into a standard CMOS process is not trivial, being limited by parasitic effects and the complexity of added non-standard process steps.

As integrated circuit processes have moved to smaller dimensions and lower supply voltage, inverter-based CMOS-based ring oscillators have become increasingly attractive. In voltage-controlled oscillators, the frequency is tuned by adjusting the supply voltage, which results in frequencies in a specific tuning range. However, when frequencies are required outside of this tuning range, multiple different oscillator designs must be utilized. Designing a different oscillator for each application is extremely costly and time consuming.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a ring oscillator for ultra-wide frequency tuning range, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for tuning an oscillator. Exemplary aspects of the method may comprise dividing a desired frequency range of a delay-cell based ring oscillator into segments, and tuning the oscillator over an ultra-wide frequency range by utilizing these divided segments. The enabled segment may determine the frequency range and the oscillator may be tuned within these segments. The delay may be adjusted utilizing a negative skew technique, and may be controlled by one or more digital codes. The oscillating frequency within each segment may be adjusted utilizing a control voltage or control current, using an input control voltage. The voltage or current may be buffered and utilized as a common supply of the delay cells.

Figure 1:
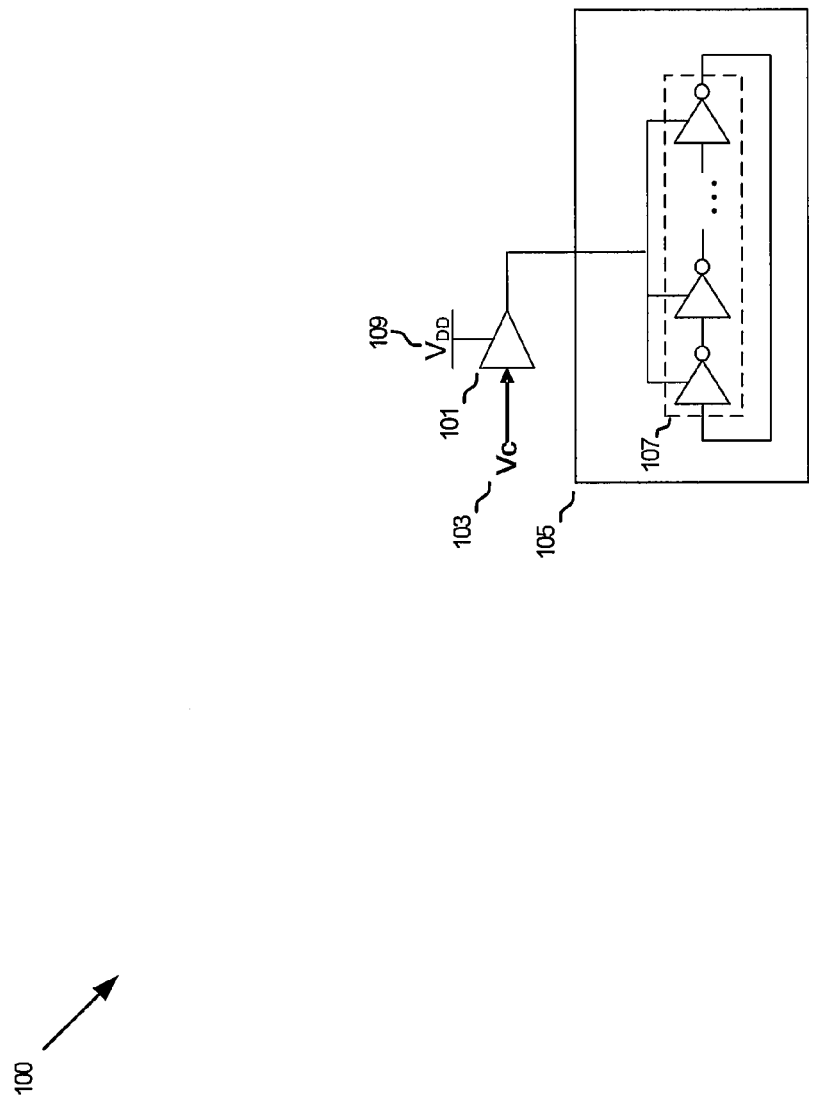
FIG. 1 is a diagram illustrating an exemplary voltage-controlled ring oscillator in connection with an embodiment of the invention.

FIG. 1 is a diagram illustrating an exemplary voltage-controlled ring oscillator in connection with an embodiment of the invention. Referring to FIG. 1, the ring oscillator 105 may comprise a series of inverter cells 107. The voltage supply 109, $V_{DD}$, and the control voltage 103 may be coupled to the voltage buffer 101. An inverter-based ring oscillator may comprise an odd number of inverters coupled with the output of the first stage coupled to the input of the second stage, the output of the second stage coupled to the input of the third stage, and so on, until the final stage, where the output may be coupled to the input of the first stage. The output signal from the voltage buffer may be coupled to the inverter stages as the voltage supply.

In operation, since the output of each stage may be inverted from the input, or the logical NOT of the input, the output signal of a final odd numbered stage may be the logical NOT of the input of the first stage. However, due to the inherent delay of each stage, the output signal from the last stage may be delayed by an amount determined by the delay of each stage and the number of stages. The output signal may then be input to the first stage, which may invert the input, and the cycle repeats. Thus, an oscillating condition may be generated, with the period of each half-wave determined by the time delay of the ring. A small number of inverter stages may result in a higher frequency, whereas a large number of inverter stages may result in lower frequency.

In one embodiment of the invention, the control voltage 103 may be adjusted to determine the frequency of the ring oscillator 105. With a well designed voltage buffer 101, the ring oscillator 105 may exhibit linear gain and low sensitivity to noise on the voltage supply 109. In operation, the control voltage may adjust the oscillator frequency by changing the switching time of each stage. As each stage may comprise CMOS inverters, a switching time may be associated with a capacitance charging in the gate of the devices. A higher control voltage may lead to a higher voltage applied to the inverter inputs, which may lead to shorter charging times, resulting in a higher frequency. A lower voltage may result in longer charging times, and lower frequency.

The control voltage 103 may be supplied by a voltage buffer 101, which may be supplied by rail voltage 109. The voltage buffer may serve to protect the ring oscillator from noise in the supply voltage, which may cause frequency swings.

Figure 2:
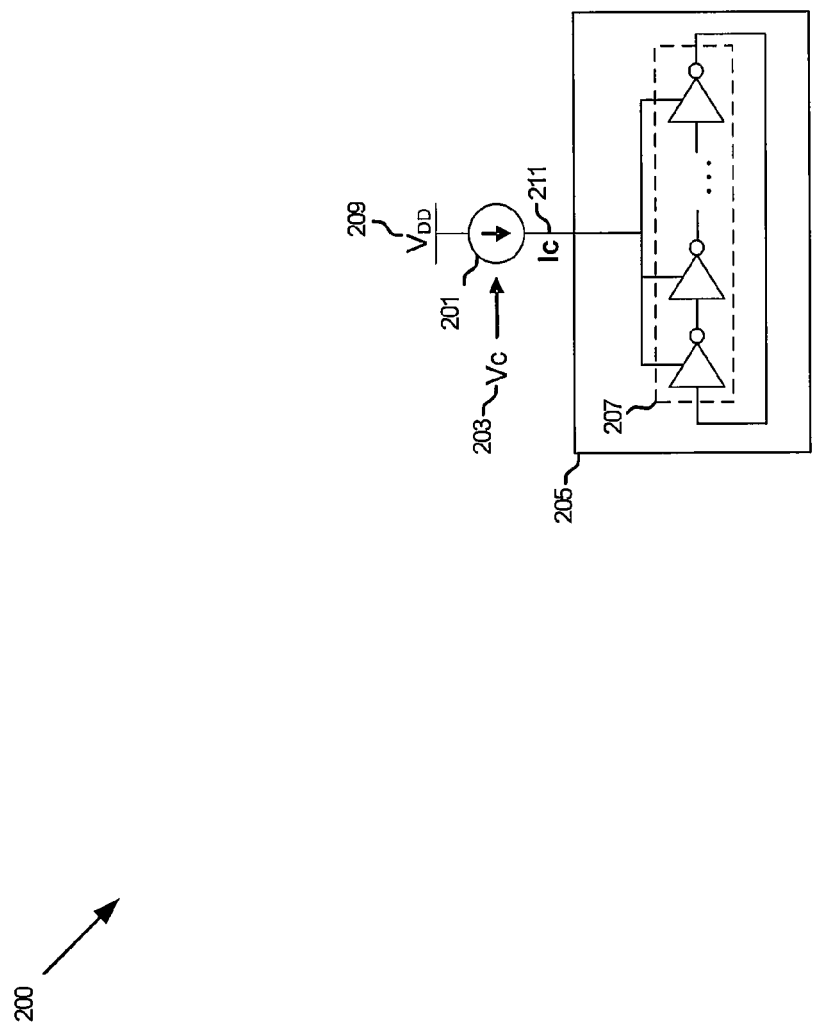
FIG. 2 is a diagram illustrating an exemplary current-controlled ring oscillator in connection with an embodiment of the invention.

FIG. 2 is a diagram illustrating an exemplary current-controlled ring oscillator in connection with an embodiment of the invention. Referring to FIG. 2, the ring oscillator 205 may comprise a series of inverter cells 207. The inverters are coupled in a manner disclosed in FIG. 1. The control voltage 203 may be utilized to drive a voltage-to-current converter 201 which may be supplied by rail voltage 209, and the output current 211 may be coupled to the inverter cells 207 as the current supply.

In operation, the control voltage, and hence the control current 211, may be adjusted to determine the frequency of the ring oscillator 205, in a manner substantially similar to the voltage-controlled embodiment described earlier. With a well designed voltage-to-current converter 201, the ring oscillator 205 may exhibit linear gain and low sensitivity to noise on the voltage supply 209. The switching time of the CMOS transistors may be inversely proportional to the current, thus a higher current may lead to shorter delays and higher frequency, and lower current may lead to longer delay and lower frequency. Current-controlled operation is another method for controlling ring oscillator frequency as opposed to voltage-controlled operation.

Figure 3:
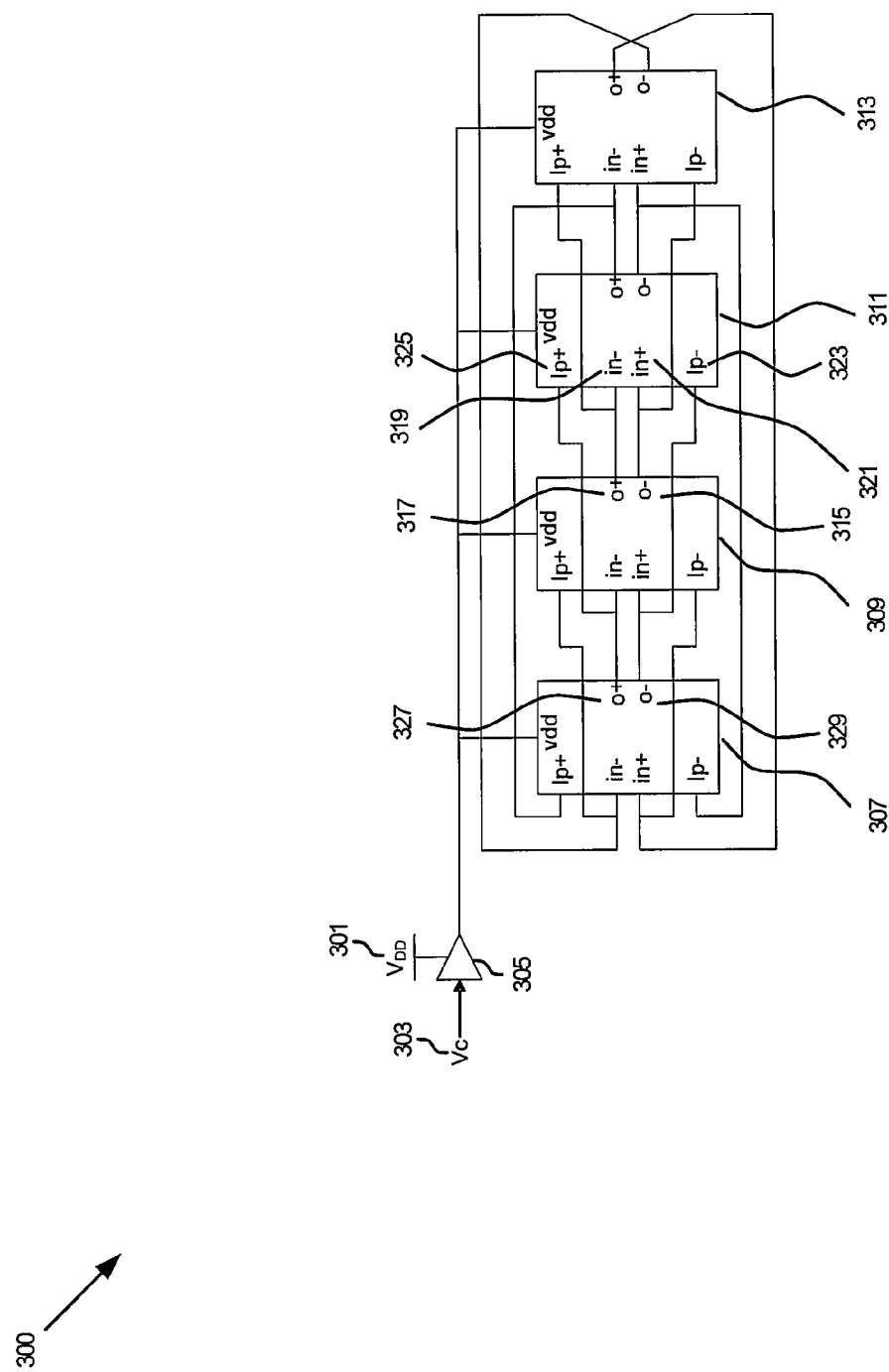
FIG. 3 is a diagram illustrating an exemplary four-stage inverter-based pseudo-differential ring oscillator in accordance with an embodiment of the invention.

FIG. 3 is a diagram illustrating an exemplary four-stage inverter-based pseudo-differential ring oscillator in accordance with an embodiment of the invention. Referring to FIG. 3, the ring oscillator comprises a series of pseudo-differential inverter stages 307, 309, 311, and 313, and a voltage buffer or voltage-to-current converter 305. The control voltage 303 may be supplied to the voltage buffer or the current-to-voltage converter 305, the output of which may then be coupled to the $V_{DD}$ terminal of the inverter stages. Each stage may have two pairs of complementary inputs, for example, the primary inputs 319 and 321 from the third stage 311, which may be coupled to the outputs 315 and 317 of the second stage 309, while the secondary inputs 323 and 325 of the third stage 311 may be coupled to the outputs 327 and 329 of the first stage 307. The outputs of each stage, for example 315 and 317 in the second stage 309 may be coupled to the primary inputs 319 and 321 of the third stage 311. This coupling scheme may be repeated for each stage, with the output terminals of each stage coupled to the inputs of the next stage as well as to the secondary inputs of the stage after that. The last stage outputs may be coupled to the inputs of the first stage and the secondary inputs of the second stage.

In one aspect of the invention, the delay cells may be operated at a higher frequency by utilizing a negative skew delay technique wherein the input signals to each cell may be fed to a secondary input of the next cell. This connection may increase the frequency of the oscillator by inverting the input at the fourth stage 313 before it would normally be switched with the standard input, providing negative skew, which may reduce the delay of the inverter and increase the frequency of the oscillator.

Figure 4:
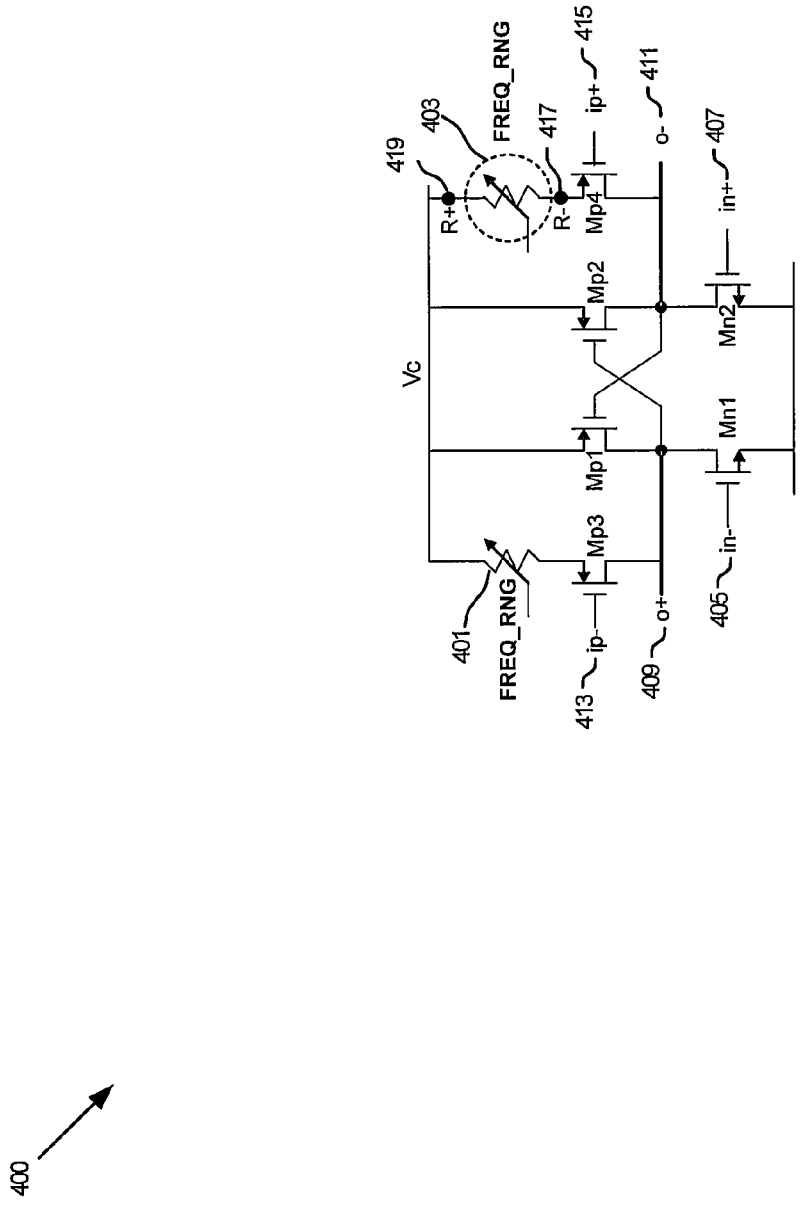
FIG. 4 is a diagram illustrating an exemplary tunable delay cell in accordance with an embodiment of the invention.

FIG. 4 is a diagram illustrating an exemplary tunable delay cell in accordance with an embodiment of the invention. Referring to FIG. 4, the tunable delay cell 400 may comprise NMOS transistors Mn1, Mn2, PMOS transistors Mp1, Mp2, Mp3 and Mp4, and variable resistors 401 and 403. The NMOS transistors Mn1 and Mn2, and the PMOS transistors, Mp1 and Mp2 may be cross-coupled to form a pseudo-differential inverter. The PMOS transistors Mp3 and Mp4 and variable resistors 401 and 403 may comprise a negative skew component of the oscillator. Although the NMOS and PMOS transistors are coupled as shown in FIG. 4, the invention is not limited in this regard. Accordingly, in other embodiments of the invention, the NMOS and PMOS transistors may be interchanged.

In accordance with an exemplary embodiment of the invention, a gate of the transistor Mp1 may be coupled to corresponding drain terminals of the transistors Mn2, Mp2, and Mp4, which may be configured as a negative differential output, o−, connection 411. A gate of the transistor Mp2 may be coupled to corresponding drain terminals of Mn1, Mp1, and Mp3, which may be configured as a positive differential output, o+, the output connection 409. The input signals 405 and 407 may be coupled to the outputs of the previous stage. The input signals 413 and 415 to the PMOS transistors Mp3 and Mp4 may be coupled to the inputs of a previous stage. A gate of the transistor Mn1 may be configured as a negative differential input, and a gate of transistor Mn2 may be configured as a positive differential input, in+. The gate terminals of Mp3 and Mp4 may be configured as differential inputs Ip− and ip+, which may be referenced as 413 and 415 respectively.

The control voltage may be coupled to the source terminals of Mp1 and Mp2, as well as to each of the variable resistors, 401 and 403. The variable resistors may also be coupled to the source terminals of Mp3 and Mp4.

In operation, the input terminals may be biased with input 407 high and 405 low, for example. This may turn on Mn2, forcing output signal 411 low, which may turn on Mp1 forcing output signal 409 high, which may turn off Mp2. Then, if the inverted signal is applied, such as when the inverted signal is applied at the first stage from the output of the last stage after one half cycle, with input terminal 405 switched high and input terminal 407 switched low, the NMOS transistor Mn1 may turn on, forcing the output 409 low, which may turn PMOS transistor Mp2 on, forcing the output 411 high.

In another embodiment of the invention, to utilize negative skew, input signals may be applied to the negative and positive differential inputs, 413 and 415 respectively, from the input of the previous stage, which may be inverted from the inputs 405 and 407 of this stage. In operation, the input 407 may be asserted high, and the input 405 asserted low, for example, which as described above may force the outputs 411 low and 409 high. Prior to a point in which the input signals would invert from the delay of the entire inverter ring, the input 415 may be asserted low and the input 413 may be asserted high, from the stage immediately prior to this one.

This may turn on transistor Mp4, switching output 411 to high, which may result in the PMOS transistor Mp1 being turned off. In instances where the input 413 to the PMOS transistor MP3 may be high, the PMOS transistor Mp3 may also be turned off forcing output 409 low. This input signal to 413 and 415 from a prior stage, or pre-charging, may cause the inverter to switch earlier than in a standard inverter, thus generating the negative skew of the ring oscillator.

If the inverted condition is applied, for example, the input 405 may be asserted high, the input 407 may be asserted low, which as described earlier may result in the output 409 being low, and the output 411 being high. In instances where an inverted signal may be applied to secondary inputs, for example, the input 413 is asserted low and the input 415 is asserted high, the PMOS transistor Mp3 may be turned on, which may switch the output 409 to high, which may result in the transistor Mp2 being turned off. In instances where the input 415 to the transistor Mp4 may be high, the PMOS transistor Mp4 may also be turned off, switching the output 407 to low. This may result in the inverter stage being switched earlier than it would without the negative skew, which may increase the oscillator frequency.

The frequency segment of the tunable delay cell 400 may be selected by adjusting a value of the variable resistors 401 and 403. The value of the variable resistors 401 and 403 may control the amount of delay reduction due to the negative skew, and may be selected so as to cause an overlap of frequencies between frequency segments. When the value of the variable resistors 401 and 403 approaches infinity, for example, the negative skew may be eliminated causing the delay cell to behave as a conventional pseudo-differential inverter, operating at the lowest frequency. As the value of the variable resistors 401 and 403 is reduced to zero, the delay may be reduced to a minimum, thus maximizing the frequency for the delay cell.

The frequency of the tunable delay cell 400 may be tuned within the selected frequency segment by adjusting the control voltage Vc. The control of the frequency by adjusting the value of the variable resistors 401 and 403 may be used in conjunction with the common supply voltage frequency adjustment described with respect to FIG. 3 to extend the frequency tuning range of a ring oscillator 300. Each inverter stage of the ring oscillator 300 may be implemented with the tunable delay cell 400. The frequency tuning range of the ring oscillator 300 may be divided into several segments, which may be digitally selected by programming the value of the variable resistors 401 and 403 in the delay cell 400. Within the selected frequency segment, the oscillating frequency may be tuned by a control voltage 303, or a control current 211, which may be coupled to the power supply of the delay cells 207.

Figure 5:
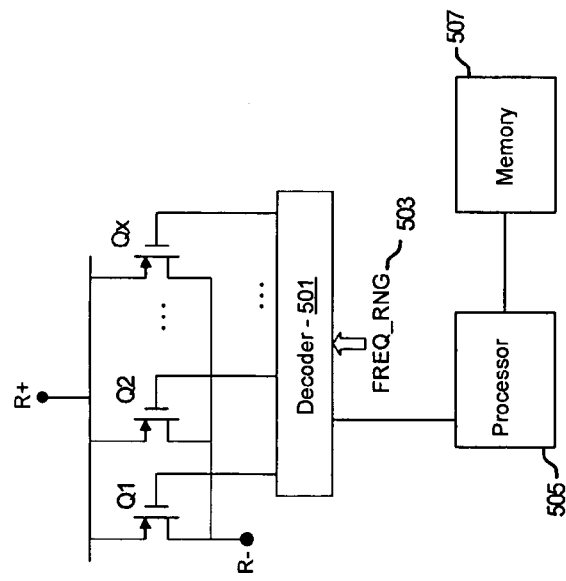
FIG. 5 is a diagram illustrating exemplary variable resistance switches in accordance with an embodiment of the invention.

FIG. 5 is a diagram illustrating exemplary variable resistance switches in accordance with an embodiment of the invention. Referring to FIG. 5, there is shown a frequency range selector 403, which may correspond to variable resistors 401 or 403 in FIG. 4, and may comprise transistors Q1, Q2, ... Qx, a decoder 501, a processor 505, and memory 507. The processor 505, may comprise suitable logic, circuitry, and/or code that may be adapted to supply a signal to the decoder that may be utilized to select the appropriate transistors to be turned on. The decoder 501, may comprise suitable logic, circuitry, and/or code that may be adapted to supply a signal to the PMOS transistors that may be utilized to turn on and off the appropriate transistors. The transistors Q1, Q2, ... Qx may be PMOS transistors coupled in parallel with the source terminals coupled to terminal R+, which may correspond to terminal R+ in FIG. 4. A gate terminal of the PMOS transistors may be coupled to the decoder 501. The drain terminals of the PMOS transistors may be coupled to form terminal R–, which may correspond to terminal R– in FIG. 4.

In operation, the PMOS transistors may be switched on or off using a digital code 503, FREQ_RNG, which may be the input to the decoder 501. The digital code, FREQ_RNG may be used to select which PMOS transistors, Q1, Q2 ... to Qx, that may be turned on. The number of switches may correspond to the number of frequency ranges desired. In an embodiment of the invention, the transistors may be of varying sizes to result in various resistance values. In another embodiment of the invention, the resistance values may be also be determined by the number of switches.

In an embodiment of the invention, a method and system is described for tuning an oscillator by dividing a desired frequency range of a delay-cell based ring oscillator 300 into segments, and tuning the oscillator over an ultra-wide frequency range by utilizing these divided segments. The enabled segment may determine the frequency range and the oscillator may be tuned within these segments. The delay may be adjusted utilizing a negative skew technique, and may be controlled by one or more digital codes 503. The oscillating frequency within each segment may be adjusted utilizing a control voltage 303 or control current 211. The voltage or current may be buffered and utilized as a common supply of the delay cells 207.

In an embodiment of the invention, a method and system is described for controlling frequency segments in a ring oscillator 300 using variable resistance switches 401 and 403, based on a required frequency range, and adjusting the output frequency with a control voltage 303. The frequency of the ring oscillator may also be determined using a control current 211. The frequency range may be digitally controlled utilizing a tunable delay circuit 400. The delay in each delay cell, for example 307, 309, 311, and 313, may be adjusted by utilizing a negative skew method. The tunable delay circuit 400 may be controlled using a digital code. The stages in the ring oscillator may comprise a differential or single-ended input.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several coupled computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for tuning an oscillator, the method comprising:
    dividing a desired frequency range of a delay-cell based ring oscillator into a plurality of segments; and
    tuning said delay-cell based ring oscillator to operate over an extended frequency range based on said dividing by selectively configuring a delay of one or more delay cells of said ring oscillator, wherein said selective configuring comprises adjusting a negative skew of signals to differential inputs of one or more of said delay cells.

2. The method according to claim 1, comprising enabling a portion of a plurality of segments in said delay-cell based ring oscillator based on a required output frequency range.

3. The method according to claim 1, comprising coarse tuning said desired frequency range via said adjusting of said negative skew in said delay-cell based ring oscillator.

4. The method according to claim 1, wherein said adjusting of said negative skew comprises configuring a resistance associated with said differential inputs.

5. The method according to claim 1, wherein said differential inputs have has a negative skew compared to a primary input of said delay cells.

6. The method according to claim 4, comprising changing said delay of said one or more of said plurality of delay cells using one or more digital codes to configure said resistance associated with said differential inputs.

7. The method according to claim 1, comprising controlling an oscillating frequency of said ring oscillator in a segment within said desired frequency range using an input control voltage.

8. The method according to claim 7, wherein said controlling said oscillating frequency comprises buffering said input control voltage and using said buffered input control voltage as a common supply voltage for said delay cells in said delay-cell based ring oscillator.

9. The method according to claim 7, wherein said controlling said oscillating frequency comprises converting said input control voltage to a control current.

10. The method according to claim 9, wherein said controlling said oscillating frequency comprises using said control current as a common current supply of said delay cells in said delay-cell based ring oscillator.

11. A system for tuning an oscillator, the system comprising:
    one or more circuits that enable dividing a desired frequency range of a delay-cell based ring oscillator into a plurality of segments; and
    wherein said one or more circuits enable tuning said delay-cell based ring oscillator to operate over an extended frequency range based on said dividing by selectively configuring a delay of one or more delay cells of said ring oscillator, wherein said selective configuring comprises adjusting a negative skew of signals to differential inputs of one or more of said delay cells.

12. The system according to claim 11, wherein said one or more circuits enables a portion of a plurality of segments in said delay-cell based ring oscillator based on a required output frequency range.

13. The system according to claim 11, wherein said one or more circuits enables coarse tuning said desired frequency range via said adjusting of said negative skew in said delay-cell based ring oscillator.

14. The system according to claim 11, wherein said one or more circuits enables adjusting said negative skew by configuring a resistance associated with said differential inputs.

15. The system according to claim 11, wherein said differential inputs have a negative skew compared to a primary input of said delay cells.

16. The system according to claim 14, wherein said one or more circuits enables changing said delay of said one or more of said plurality of delay cells using one or more digital codes to configure said resistance associated with said differential inputs.

17. The system according to claim 11, wherein said one or more circuits enables controlling an oscillating frequency of said ring oscillator in a segment within said desired frequency range using an input control voltage.

18. The system according to claim 17, wherein said one or more circuits enables controlling said oscillating frequency by buffering said input control voltage and using said buffered input control voltage as a common supply voltage for said delay cells in said delay-cell based ring oscillator.

19. The system according to claim 17, wherein said one or more circuits enables controlling said oscillating frequency by converting said input control voltage to a control current.

20. The system according to claim 19, wherein said one or more circuits enables controlling said oscillating frequency using said control current as a common current supply of said delay cells in said delay-cell based ring oscillator.

21. A machine-readable storage having stored thereon, a computer program having at least one code section for tuning an oscillator, the at least one code section being executable by a machine for causing the machine to perform steps comprising:
    dividing a desired frequency range of a delay-cell based ring oscillator into a plurality of segments; and
    tuning said delay-cell based ring oscillator to operate over an extended frequency range based on said dividing by selectively configuring a delay of one or more delay cells of said ring oscillator, wherein said selective configuring comprises adjusting a negative skew of signals to differential inputs of one or more of said delay cells.

22. The machine-readable storage according to claim 21, wherein said at least one code section comprises code for enabling a portion of a plurality of segments in said delay-cell based ring oscillator based on a required output frequency range.

23. The machine-readable storage according to claim 21, wherein said at least one code section comprises code for coarse tuning said desired frequency range via said adjusting of said negative skew in said delay-cell based ring oscillator.

24. The machine-readable storage according to claim 21, wherein said at least one code section comprises code for adjusting said negative skew by configuring a resistance associated with said differential inputs.

25. The machine-readable storage according to claim 21, wherein said at least one code section comprises code for providing said differential inputs that have a negative skew compared to a primary input of said delay cells.

26. The machine-readable storage according to claim 24, wherein said at least one code section comprises code for changing said delay of said one or more of said plurality of delay cells using one or more digital codes to configure said resistance associated with said differential inputs.

27. The machine-readable storage according to claim 21, wherein said at least one code section comprises code for controlling an oscillating frequency of said ring oscillator in a segment within said desired frequency range using an input control voltage.

28. The machine-readable storage according to claim 27, wherein said at least one code section comprises code for controlling said oscillating frequency by buffering said input control voltage and using said buffered input control voltage as a common supply voltage for said delay cells in said delay-cell based ring oscillator.

29. The machine-readable storage according to claim 27, wherein said at least one code section comprises code for controlling said oscillating frequency by converting said input control voltage to a control current.

30. The machine-readable storage according to claim 29, wherein said at least one code section comprises code for controlling said oscillating frequency by using said control current as a common current supply of said delay cells in said delay-cell based ring oscillator.

* * * * *